(12) United States Patent
Wang

(10) Patent No.: US 6,933,875 B1
(45) Date of Patent: Aug. 23, 2005

(54) PIPELINED ANALOG-TO-DIGITAL CONVERTER WITH UNEQUAL WORK TIMING

(75) Inventor: Huei-Chi Wang, Hsinchu (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 10/984,235

(22) Filed: Nov. 8, 2004

(51) Int. Cl.[7] ................................................ H03M 1/38
(52) U.S. Cl. ........................ 341/161; 341/155; 341/156
(58) Field of Search ................................ 341/161, 155, 341/156, 118, 110, 120

(56) References Cited

U.S. PATENT DOCUMENTS

| | | | | |
|---|---|---|---|---|
| 4,204,198 A | * | 5/1980 | Filipov et al. ............... | 341/143 |
| 5,274,377 A | * | 12/1993 | Matsuura et al. ............ | 341/161 |
| 5,541,602 A | * | 7/1996 | Opris et al. .................. | 341/161 |
| 6,340,944 B1 | * | 1/2002 | Chang et al. ................ | 341/161 |
| 6,359,579 B1 | * | 3/2002 | Chiang ........................ | 341/161 |

* cited by examiner

Primary Examiner—Lam T. Mai
(74) Attorney, Agent, or Firm—J.C. Patents

(57) ABSTRACT

A pipelined analog-to-digital converter with unequal work timing comprising several transfer circuits and a decoder is provided. Each transfer circuit includes an analog-to-digital sub-converter, a multiply digital-to-analog converter, a subtractor and an amplifier. The operation time of the analog-to-digital sub-converter is in a sampling time and the operation time of the multiply digital-to-analog converter, the subtractor and the amplifier is in an amplifying time. The amplifying time is longer than the sampling time. The decoder receives the digital bit signals produced by the analog-to-digital sub-converter of the transfer circuit to produce digital signals.

8 Claims, 3 Drawing Sheets

PIPELINED ANALOG-TO-DIGITAL CONVERTER WITH UNEQUAL WORK TIMING

BACKGROUND OF THE INVENTION

1. Field of the Invention

The present invention relates to an analog-to-digital converter. More particularly, the present invention relates to a pipelined analog-to-digital converter.

2. Description of the Related Art

Analog-to-digital conversion is a process of changing an analog signal into a digital format. In general, the value of a digital signal is determined by quantizing the analog signal. At present, most high frequency and versatile analog-to-digital converters (ADC) have a pipelined design. Typically, pipelined analog-to-digital converters are used in an environment demanding a high operating speed and a high resolution. In other words, pipelined analog-to-digital converters are frequently used for transmitting digital signals and video signals through transmission cables.

FIG. 1 is a block diagram showing the layout of a conventional pipelined analog-to-digital converter. As shown in FIG. 1 the pipelined analog-to-digital converter is a multi-stage device comprising a plurality of transfer circuits 100, 106, 108 and a decoder 105 coupled to each other. The analog-to-digital sub-converter (ADSC) 110 in each stage of transfer circuit (such as 100) samples, latches and quantizes the analog signal 101 from a previous stage to produce a digital bit signal 103. Thereafter, the quantized digital bit signal 103 is reconverted back to an analog signal 116 using the multiply digital-to-analog (MDAC) converter 115 according to a reference voltage (Vref). Through a subtractor 118, the converted analog signal 116 is subtracted from the previous analog signal 101 to produce a residual analog signal 117. The residual analog signal 117 is amplified through an amplifier 120 to produce an amplified analog signal 104 and then the amplified analog signal 104 is transmitted to the next stage. Each stage in the pipeline will perform the same set of operations to effect the analog-to-digital conversion. The digital bit signal 107 produced by the first stage of transfer circuit 106 represents the most significant bit (MSB) derived from the analog signal. Since the most significant bit is the leftmost bit in a binary number, its value is most critical in an analog-to-digital conversion. The digital bit signal 108 produced by the last stage (the nth stage) of transfer circuit 108 represents the least significant bit (LSB) derived from the analog signal. The least significant bit is the rightmost bit in a binary number.

At the end of processing the analog signal inside the first stage of transfer circuit 106, the residual analog signal will be directly transmitted to the second stage and the first stage is now free to process a newly input analog signal and so on for next and subsequent stages. The digital bit signal 103 of each transfer circuit 100 is transmitted to the decoder 105 in stages. As the residual analog signal is continuously passed from one transfer circuit to another in stages until the last stage of transfer circuit 108, the digital bit signal is also passed to the decoder 105 one by one. The decoder 105 collects and processes the digital bit signals 103, 107 and 109 produced by the transfer circuits 100, 106 and 108 to generate a final digital signal 150 that corresponds to the original input analog signal. Since each stage of transfer circuit resolves one single bit and passes the remaining signal to the next stage, the transfer circuit of a previous stage is prepared for resolving the next analog sample. If the pipelined analog-to-digital converter is a device for sampling N bits of analog signal, a total of (N/2)+1 timing cycles must pass since quantizing the first stage analog sample before the quantization of each analog sample is completed.

In the conventional technique, a reliable and effective pipelined operation often uses a non-overlapping timing signals. FIG. 2 shows a portion of a timing diagram of a conventional pipelined analog-to-digital converter. In fact, FIG. 2 shows a timing diagram of the transfer circuits 100 in FIG. 1 except the timing signals inside the decoder 105. As shown in FIGS. 1 and 2, A(n) represents a portion of the analog signal. The dash line arrow alongside A(n) indicates a pathway showing this portion of the analog signal passing from a previous stage of transfer circuit to the next stage of transfer circuit. Here, T indicates a timing cycle and nT indicates the nth current timing cycle. The timing cycle of each stage of transfer circuit comprises a sampling timing cycle and an amplifying timing cycle. The sampling timing cycle refers to the time spent for sampling, latching and quantizing the residual analog signal 101 from a previous stage by the ADSC 110 inside the transfer circuit 100 and generate the digital bit signal 103. The amplifying timing cycle refers to the time spent in transmitting the digital bit signal 103 to the MDAC 115, processing, latching and quantizing the digital bit signal 103 inside the MDAC 115 to produce an analog signal 116, transmitting the analog signal 101 of the previous stage of transfer circuit to the subtractor 118 and subtracting the analog signal 116 to produce the analog signal 117 and finally amplifying the analog signal 117 through the amplifier 120 to produce the analog signal 104.

In a non-overlapping timing signal system, half of the timing period is used for sampling while the other half is used for amplifying. In other words, the sampling period and the amplifying period are equal in length so that the amplifying period and the sampling period together constitute a single timing period. Therefore, the amplifying timing and the sampling timing both have a period of T/2. Using the transmission pathway of the analog signal A(n) as an example, the analog signal A(n) is output from the MDAC 115 and the amplifier 120 of the $j^{th}$ stage of transfer circuit 100 during the nT timing period. In the meantime, the ADSC 110 inside the $(j+1)^{th}$ transfer circuit stage 100 receives the amplified analog output A(n) from the amplifier 120 from the $j^{th}$ stage of transfer circuit 100. Hence, there is a direct jump from the $j^{th}$ amplifying period to the $(j+1)^{th}$ sampling period. During the timing period nT+T/2, the analog signal A(n) in the $(j+1)^{th}$ stage of transfer circuit 100 serves as the amplified output from the MDAC 115 and the amplifier 120. In the meantime, the ADSC 110 inside the $(j+2)^{th}$ stage of transfer circuit 100 receives the amplified analog data A(n) from the $(j+1)^{th}$ stage of transfer circuit. According to the aforementioned steps, the transfer circuit in the next stage is enabled.

In the conventional pipelined analog-to-digital converter, a portion of the time is spend in processing the signal inside the MDAC 115 while another portion of the time is spend in outputting the analog signal from the amplifier 120 during the amplifying period of the transfer circuit 100. However, the signal for sampling and quantizing is valid only after the analog signal 104 is output from the amplifier 120. Thus, when the conventional non-overlapping timing signal is used, the sampling period must wait in idle for the transition of the MDAC 115 in the previous stage and waste a lot of time. Furthermore, the amplifier 120 is needlessly set up in an enabled state to consume electric power.

SUMMARY OF THE INVENTION

Accordingly, at least one objective of the present invention is to provide a pipelined analog-to-digital converter with unequal working time. The pipelined analog-to-digital converter utilizes a reduction in the sampling period and a relative increase in the amplifying period to increase the efficiency of the analog-to-digital conversion and reduce the power consumption of the analog-to-digital converter.

At least a second objective of the present invention is to provide a pipelined analog-to-digital conversion method with unequal working time. The method utilizes a reduction in the sampling period and a relative increase in the amplifying period to increase the efficiency of the analog-to-digital conversion and reduce the power consumption of the analog-to-digital conversion.

To achieve these and other advantages and in accordance with the purpose of the invention, as embodied and broadly described herein, the invention provides a pipelined analog-to-digital converter with unequal working time for converting analog signals into digital signals. The pipelined analog-to-digital converter comprises several stages of transfer circuit and a decoder. Each stage of transfer circuit comprises an analog-to-digital sub-converter, a multiply digital-to-analog converter, a subtractor and an amplifier. The analog-to-digital sub-converter receives the analog signal produced by the previous stage of transfer circuit in a sampling period and then latches and generates a digital bit signal. Thereafter, the multiply digital-to-analog converter converts the digital bit signal into a second analog signal according to a reference voltage. The subtractor subtracts the second analog signal produced by the multiply digital-to-analog converter from the analog signal produced by the previous stage of transfer circuit to produce a third analog signal. After that, the amplifier amplifies the third analog signal to produce an amplified analog signal and transmit the signal to the next stage of transfer circuit. This submission of analog signal to the next stage of transfer circuit is continued until conversion is completed. The operation time of the multiply digital-to-analog converter, the subtractor and the amplifier falls within the amplifying period. The amplifying period is longer than the sampling period for operating the analog-to-digital sub-converter. The decoder generates a digital signal corresponding to the analog signal after collecting all the digital bit signals produced by the analog-to-digital sub-converter inside various transfer circuits.

According to the pipelined analog-to-digital converter of the present invention, the amplifying period is three times that of the sampling period.

According to the pipelined analog-to-digital converter of the present invention, each analog-to-digital sub-converter can resolve a single bit of binary number.

According to the pipelined analog-to-digital converter of the present invention, each analog-to-digital sub-converter can resolve 1.5 bits of binary number.

The present invention also provides a pipelined analog-to-digital conversion method having unequal working time and comprising the following steps. First, a sampling period is initiated. During the sampling period, an analog signal from the previous stage is input and converted to a digital bit signal. Next, an amplifying period is initiated. During the amplifying period, the converted digital bit signal is converted into a second analog signal according to a reference voltage. Thereafter, the second analog signal is subtracted from the input analog signal obtained from the previous stage to produce a third analog signal. Finally, the third analog signal is amplified before sending to the next stage as an input analog signal. The amplifying period is longer than the sampling period. The aforementioned sampling and amplifying period are repeated in cycles until the entire process of digital-to-analog conversion is completed.

According to the pipelined analog-to-digital conversion method of the present invention, the amplifying period is three times that of the sampling period.

According to the pipelined analog-to-digital conversion method of the present invention, each analog-to-digital sub-converter can resolve a single bit of binary number.

According to the pipelined analog-to-digital conversion method of the present invention, each analog-to-digital sub-converter can resolve 1.5 bits of binary number.

In the present invention, the sampling period is shortened while the amplifying period is extended. Furthermore, the signal processing by the MDAC within the amplifying period does not overlap with the sampling period of the next stage of transfer circuit so that idling time is reduced. Ultimately, with a shorting of the timing cycle and length of the sampling period, the efficiency of the pipelined analog-to-digital converter is increased while overall power consumption of the pipelined analog-to-digital converter is reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
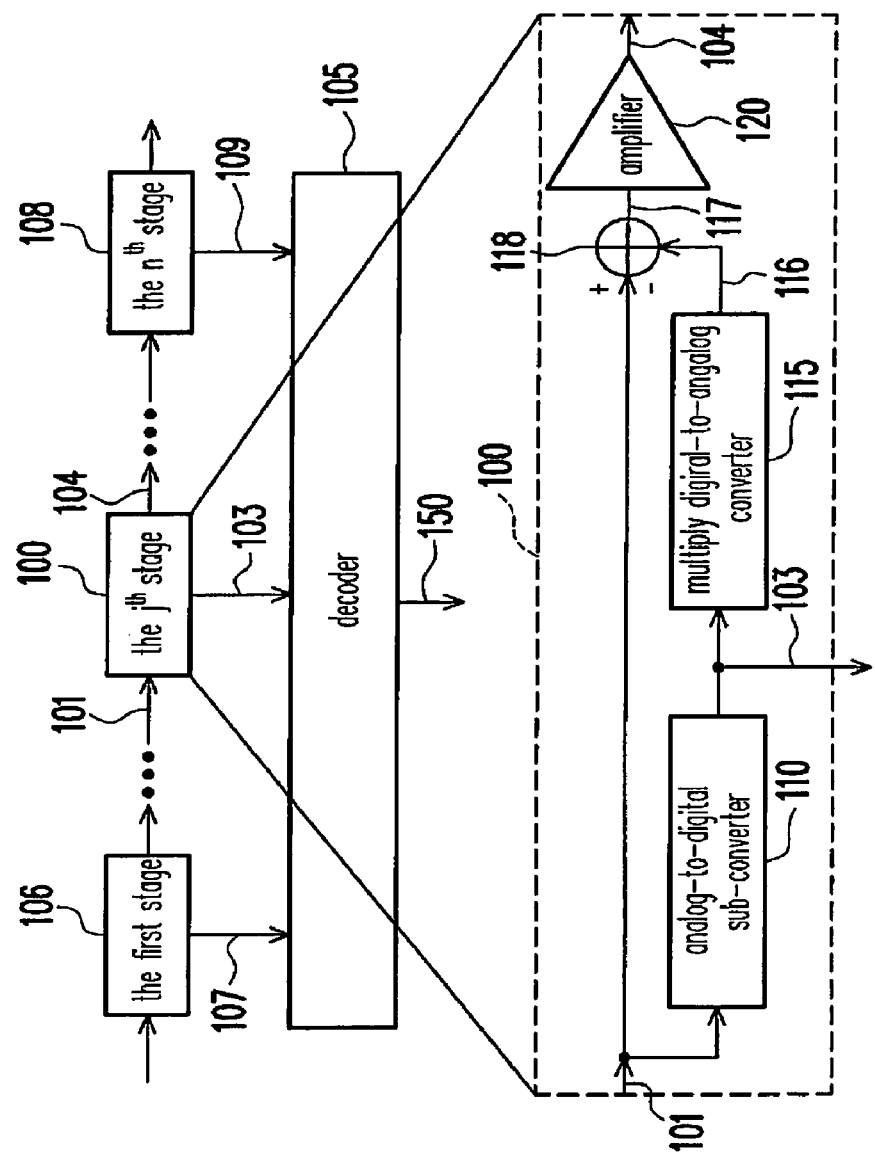
FIG. 1 is a block diagram showing the layout of a conventional pipelined analog-to-digital converter.
Figure 2:
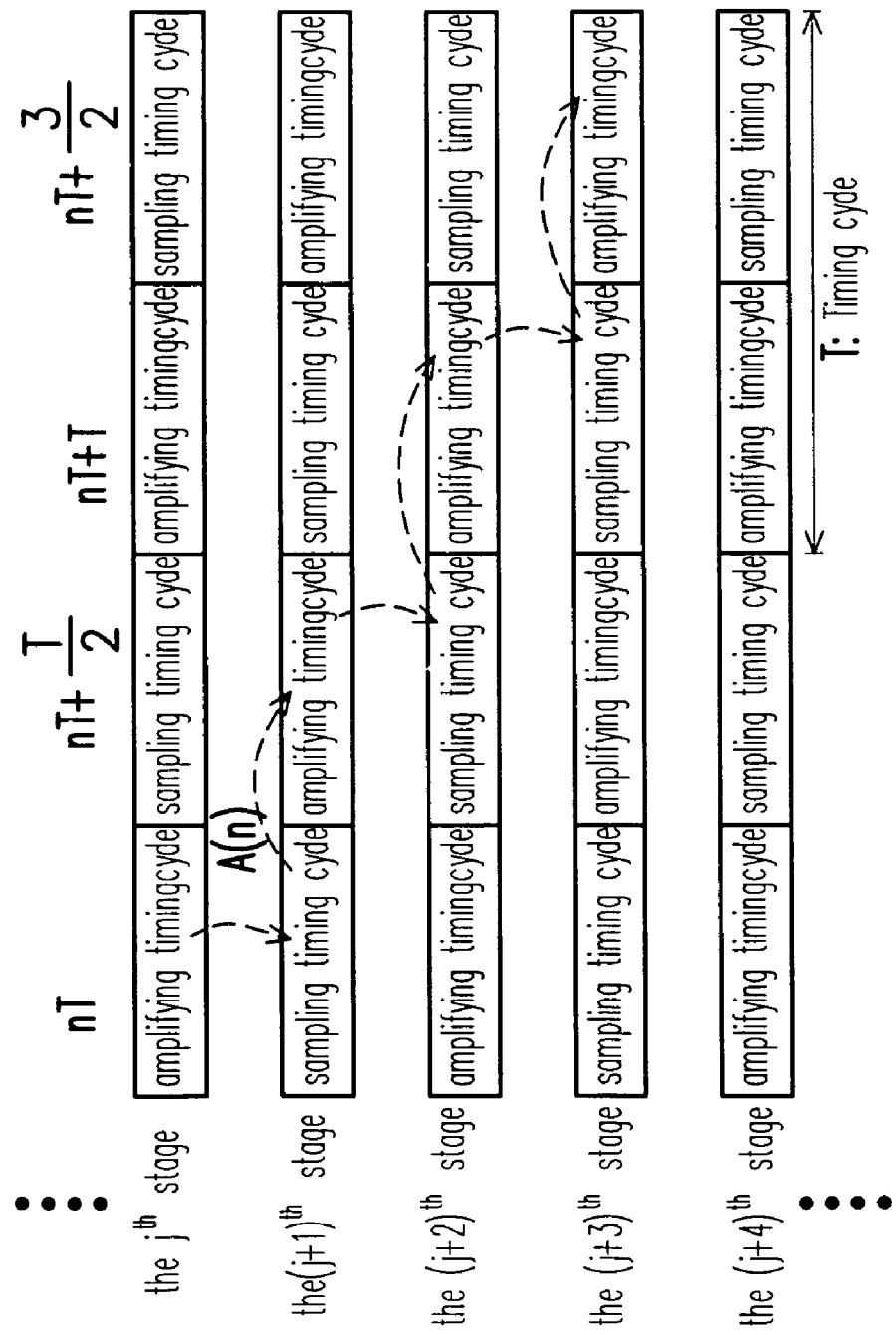
FIG. 2 shows a portion of a timing diagram of a conventional pipelined analog-to-digital converter.

Reference will now be made in detail to the present preferred embodiments of the invention, examples of which are illustrated in the accompanying drawings. Wherever possible, the same reference numbers are used in the drawings and the description to refer to the same or like parts.

In the amplifying period of the transfer circuit of a conventional pipelined analog-to-digital converter, most of the time are spent in processing signal within the MDAC and only a small portion of time is used for outputting analog signal from the amplifier. Both the MDAC and the amplifier are in an open state. However, during the sampling enabled period, only the analog signal from the amplifier of the previous stage can be used for sampling and quantizing. The sampled data while the MDAC in the previous stage is still processing signal cannot be used. Therefore, sampling must wait for the completion of the processing within the MDAC. Yet, the ADSC is in an enabled state during this period wasting electrical power unnecessarily. By shortening the sampling period and increasing the amplifying period, the present invention increases overall analog-to-digital conversion efficiency.

Figure 3:
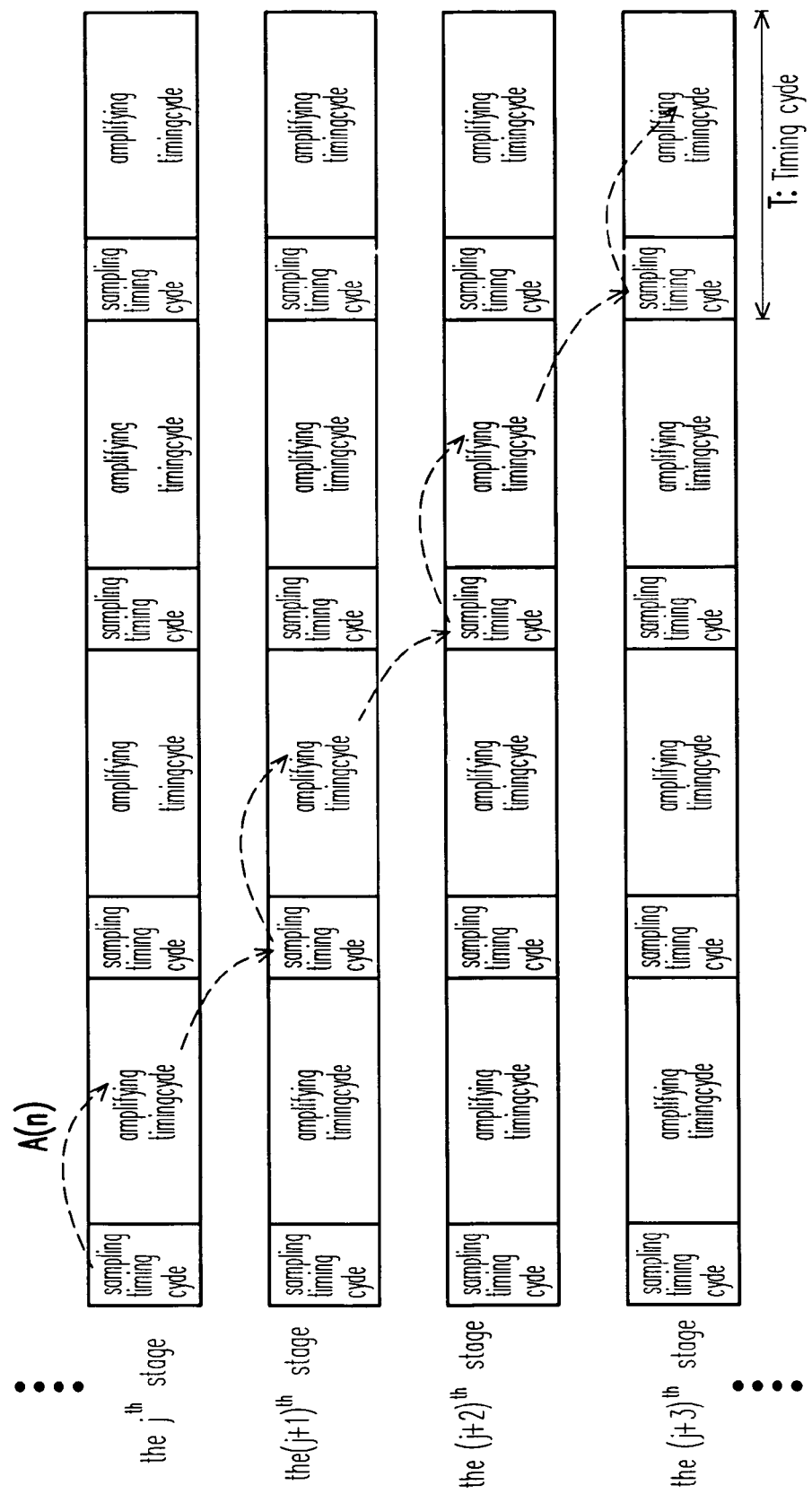
FIG. 3 shows a portion of a timing diagram of a pipelined analog-to-digital converter according to one preferred embodiment of the present invention.

FIG. 3 shows a portion of a timing diagram of a pipelined analog-to-digital converter according to one preferred embodiment of the present invention. In fact, FIG. 3 shows a timing diagram of the transfer circuits only. The timing diagram of the decoder inside the pipelined analog-to-digital converter is not shown. The operation block diagram in the present embodiment is almost identical to the conventional one. However, due to the deployment of a different algorithm, each stage can resolve a single bit or 1.5 bits. If a 1.5 bit per stage of transfer circuit is used, each stage may output a 1, 0 or −1 and the output Dj can be derived using the formula: Vj+1=2×Vj−Dj×Vref, where Vref is a reference voltage for the digital signal. On the other hand, if a 1 bit per stage of transfer circuit is used, each stage may output a 1 or 0. As shown in FIGS. 1 and 3, A(n) represents a portion of the analog signal. The dash line arrow alongside A(n) indicates a pathway showing this portion of the analog signal passing from a previous stage of transfer circuit to the next stage of transfer circuit. Here, T indicates a timing cycle. The timing cycle of each stage of transfer circuit 100 comprises a sampling timing cycle and an amplifying timing cycle. The sampling timing cycle refers to the time spent for sampling, latching and quantizing the residual analog signal 101 from a previous stage by the ADSC 110 inside the transfer circuit 100 and generate the digital bit signal 103. The amplifying timing cycle refers to the time spent in transmitting the digital bit signal 103 to the MDAC 115, processing, latching and quantizing the digital bit signal 103 inside the MDAC 115 to produce an analog signal 116, transmitting the analog signal 101 of the previous stage of transfer circuit to the subtractor 118 and subtracting the analog signal 116 to produce the analog signal 117 and finally amplifying the analog signal 117 through the amplifier 120 to produce the analog signal 104.

The sampling period in the present invention is 25% of the timing period, that is, the sample period is T/4. In other words, the amplifying period in the present invention is 75% or the amplifying period is 3T/4. Because signal processing inside the MDAC 115 requires a longer time within the amplifying period, a longer period is provided. Using the transmission pathway of the analog signal A(n) as an example, the analog signal A(n) is obtained from the ADSC 110 of the $j^{th}$ stage of transfer circuit 100 by sampling from the $(j-1)^{th}$ stage of transfer circuit 100 (not shown) during the T/4 sampling period to produce the digital bit signal 103. During the 3T/4 amplifying period, the MDAC 115 inside the $j^{th}$ stage of transfer circuit 100 converts the digital bit signal 103 into the analog signal 116 while the subtractor 118 subtracts the analog signal 116 from the residual analog signal 101 of A(n) to produce the analog signal 117. Thereafter, the amplifier 120 amplifies the analog signal 117 to produce the analog signal 104. Next, the sampling period of the $(j+1)^{th}$ stage of transfer circuit is initiated so that the ADSC 110 inside the $(j+1)^{th}$ stage of transfer circuit 100 receives the analog signal of the previous stage and latches and quantizes the analog signal to produce the digital bit signal 103. During the 3T/4 amplifying period of the $(j+1)^{th}$ stage, the MDAC 115 inside the $(j+1)^{th}$ stage of transfer circuit 100 converts the digital bit signal 103 into the analog signal 116 while the subtractor 118 subtracts the analog signal 116 from the residual analog signal 101 of A(n) to produce the analog signal 117. After that, the amplifier 120 is enabled to amplify the analog signal 117 to produce the amplified analog signal 104. Next, the sampling period of the $(j+2)^{th}$ stage of transfer circuit is initiated and the aforementioned sequence of steps is repeated in cycles until the analog-to-digital conversion process is completed.

In addition, a non-ideal MDAC having a limited operating amplifier gain, a limited settling time and capacitor matching can be represented by the following formula:

$Vres=G*(Vin-VDAC)$, where $$G = \left(1 + \frac{C_S}{C_F}\right) \times \left(1 - e^{\frac{t}{\tau}}\right) \times \frac{1}{1 + \frac{1}{A \times f}}; (1 + C_S/C_F)$$

is the voltage gate factor, the index inside the second bracket is the settling period of the amplifier in unipolar operation (τ is the time constant of SC gain such that the time constant is the −3 dB open circuit frequency bandwidth of the operational amplifier for determining the feedback parameters). The third item is related to the limited operating gain A and the feedback factor f. The processing of the operational amplifier at −3 dB open circuit frequency bandwidth is based on the largest single transmission frequency bandwidth. The operational amplifier also will consume considerable power in the amplifying phase to constitute and maintain the open circuit frequency bandwidth of the operational amplifier with the largest single transmission frequency bandwidth and stabilizes the output requirements. The amplifier of the present embodiment is designed using a unipolar operational amplifier. In the 200M samples/second operation, every pair of non-overlapping phases must be smaller than 2.5 ns. Hence, the open circuit frequency bandwidth of the operational amplifier must at least vibrates at 1.2 GHz in order to settle for a 0.5 permitted bit error in 8-bit resolution. The present invention only requires an operating frequency up to 800 MHz for the same requirements and hence can save considerable electrical power.

In summary, the present invention shortens the sampling period while extending the amplifying period. Furthermore, the signal processing by the MDAC within the amplifying period does not overlap with the sampling period of the next stage of transfer circuit so that idling time is reduced. Consequently, with a shorting of the timing cycle and length of the sampling period, the efficiency of the pipelined analog-to-digital converter is increased while overall power consumption of the pipelined analog-to-digital converter is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pipelined analog-to-digital converter with unequal working time for converting an analog signal into a digital signal, comprising:
    a plurality of transfer circuits each having:
        an analog-to-digital sub-converter for receiving an analog signal from the previous stage of transfer circuit and generating a digital bit signal during a sampling period;
        a multiply digital-to-analog converter for receiving the digital bit signal produced by the analog-to-digital sub-converter and converting the digital bit signal into a second analog signal according to a reference voltage;

a subtractor for receiving the analog signal from the previous stage of transfer circuit and the second analog signal produced by the multiply digital-to-analog converter and subtracting the second analog signal from the analog signal produced by the previous stage of transfer circuit to produce a third analog signal; and an amplifier for receiving the third analog signal from the subtractor, amplifying the analog signal and transmitting the amplified analog signal to the next stage of transfer circuit, wherein the operation time of the multiply digital-to-analog converter, the subtractor and the amplifier is an amplifying period and the amplifying period is longer than the sampling period; and a decoder for receiving the digital bit signal from the analog-to-digital sub-converter inside various transfer circuits and producing a digital signal corresponding to the analog signal.

2. The pipelined analog-to-digital converter of claim 1, wherein the amplifying period is three times that of the sampling period.

3. The pipelined analog-to-digital converter of claim 1, wherein each analog-to-digital sub-converter can resolve a single bit of binary number.

4. The pipelined analog-to-digital converter of claim 1, wherein each analog-to-digital sub-converter can resolve 1.5 bits of binary number.

5. A pipelined analog-to-digital conversion method with unequal working time, comprising the steps of:

receiving an analog signal from a previous input stage and converting the analog signal into a digital bit signal during a sampling period;

receiving the digital bit signal, converting the digital bit signal into a second analog signal according to a reference voltage, subtracting the second analog signal from the analog signal from the previous stage to produce a third analog signal and finally, amplifying the third analog signal and transmitting the amplified analog signal to the next stage during an amplifying period, wherein the amplifying period is longer than the sampling period; and repeating the steps carried out within the aforementioned sampling period and the amplifying period in cycles until analog-to-digital conversion is completed.

6. The pipelined analog-to-digital conversion method of claim 5, wherein the amplifying period is three times that of the sampling period.

7. The pipelined analog-to-digital conversion method of claim 5, wherein the converted digital bit signal obtained from a sampling period within each stage resolves a single bit of a binary number.

8. The pipelined analog-to-digital conversion method of claim 5, wherein the converted digital bit signal obtained from a sampling period within each stage resolves 1.5 bits of a binary number.

* * * * *